| United States Patent [19] | [11] Patent Number: 4,769,399 |
| --- | --- |
| Schenz | [45] Date of Patent: Sep. 6, 1988 |

[54] EPOXY ADHESIVE FILM FOR ELECTRONIC APPLICATIONS

[75] Inventor: James L. Schenz, White Bear Lake, Minn.

[73] Assignee: Minnesota Mining and Manufacturing Company, St. Paul, Minn.

[21] Appl. No.: 25,009

[22] Filed: Mar. 12, 1987

[51] Int. Cl.[4] .......................... C08K 9/06; C08L 63/00
[52] U.S. Cl. ..................................... 523/213; 523/427; 523/428; 525/524; 525/525; 525/930
[58] Field of Search ....................... 525/524, 525, 930; 523/213, 427, 428

[56] References Cited

U.S. PATENT DOCUMENTS

| 3,873,637 | 3/1975 | Fujiwara et al. | 525/524 |
| 3,888,942 | 6/1975 | Tsen | 525/930 |
| 4,591,623 | 5/1986 | Nakajima et al. | 525/524 |
| 4,644,023 | 2/1987 | Gray | 525/524 |

*Primary Examiner*—John C. Bleutge
*Assistant Examiner*—David W. Woodward
*Attorney, Agent, or Firm*—Donald M. Sell; Gerald F. Chernivec; Adonis A. Neblett

[57] ABSTRACT

An adhesive composition which is particularly suitable for use as a die-attach adhesive. The adhesive composition comprises the reaction product of an admixture of an effective amount of a phenoxy resin, at least one epoxy resin and a fluorene curative.

12 Claims, No Drawings

EPOXY ADHESIVE FILM FOR ELECTRONIC APPLICATIONS

FIELD OF INVENTION

The present invention relates to an adhesive composition, and particularly to an adhesive composition having properties especially suited for use in a conductive die-attach adhesive composite.

BACKGROUND ART

Semiconductors, such as integrated circuits, are formed on wafers which are then cut into dice or chips that individually may be mounted on substrates. Typically, the substrate is electrically and thermally conductive, with mounting providing both good electrical and good thermal conductivity between the die and the substrate.

Known methods for attaching a die to an electrically and thermally conductive substrate include employing a solder or eutectic alloy such as a gold-silicon alloy, employing a spreadable adhesive consisting of a heat-curing epoxy resin composition filled with fine metal particles; and employing an electrically and thermally conductive adhesive composition which comprises an adhesive containing fine metal particles or a deformable metal foil. See, for example, U.S. Pat. No. 4,606,962.

The metal eutectics are used most specifically in the area of power devices, to provide a metallurgical interface between a silicon die and the heat-sinking metal or ceramic substrate with optimum thermal and electrical conductivity. This technique is relatively successful for smaller devices, but is not desirable for use with very large dice, which may approach 0.6 inch on a side. The differential coefficients of expansion of the substrate and the silicon die can result in a larger die cracking under the stresses imparted by a very rigid bonding medium, and may result in its subsequent failure.

Epoxy-silver compositions are extensively used for commercial die-bonding, as they provide an often suitable compromise in terms of cost, stress-relief and electrical/thermal conductivity. However, epoxy-silver compositions have the following undesirable characteristics: the lack of uniformity of dispersion of silver particles within the adhesive composition, the lack of uniformity of the mixture of two component systems (epoxy and curative), the lack of coplanar (die/substrate) maintenance during cure, the presence of resin bleed into the surrounding area or onto the die's active surface prior to curing, and unsuitably low shear strengths, as measured by the military standard, MIL-883C.

The upper temperature performance of these organic adhesives is typically less than that of the metallurgical bonding materials, and is related to the glass transition temperature ($T_g$) of the composition. The usual way to improve this upper temperature performance is to use a very highly cross-linked adhesive system, thus raising the $T_g$. This approach, however, contributes to increased stress on a die, an undesirable characteristic as discussed above.

A superior die-attach system is described in copending application U.S. Ser. No. 24,997-filed on even date. It provides an adhesive composite having a resilient structured conductive layer with an adhesive layer on each side. This adhesive composite provides electrical and thermal conductivity between a die and a substrate and through its resiliency can maintain connection when exposed to extremes in temperature.

It is therefore highly desirable to provide an adhesive composition capable of being used in such an adhesive composite which is capable of rapidly curing to effect bonding of dice to a variety of substrates, exhibits little or no tack and has a suitable shelf life at or below room temperature, can be readily adhered to and diced to precise size with a silicon wafer, and exhibits none of the bleeding and migrating characteristics common to adhesive/metal pastes discussed above. It is further desirable that the adhesive composition exhibit superior shear strength and adhesion to a multiplicity of substrates and surfaces, has excellent resistance to degradation due to thermal excursions as high as 350° C. and greater and exhibit improved resistance to moisture penetration and degradation of adhesion in aging tests conducted over a range from −65° C. to 150° C.

DISCLOSURE OF THE INVENTION

The present invention provides an adhesive composition having these desired properties which is particularly suitable for use in a resilient adhesive composite in a die-attach application. The adhesive composition comprises the reaction product of an admixture of an effective amount of a phenoxy resin, at least one epoxy resin and a fluorene curative.

The phenoxy resin is represented by the general formula

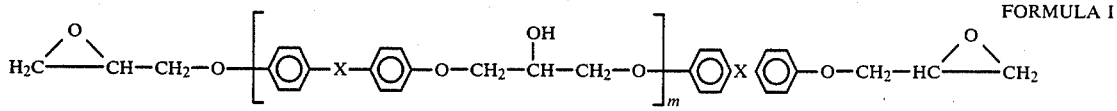

FORMULA I where $m = 50$ to $150$ and $X =$ a single bond, $-CH_2-$ or $-C(CH_3)_2-$ The at least one epoxy resin is either $Y_E$ or $Z$ or a mixture thereof wherein

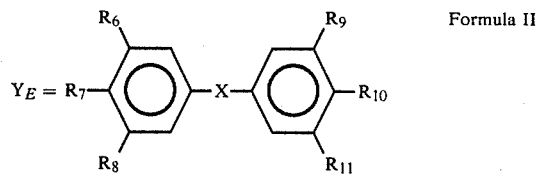

Formula II where $X =$ a single bond, $-CH_2-$, $-C(CH_3)_2-$,

and $R_6$, $R_7$, $R_8$, $R_9$, $R_{10}$, $R_{11}$ are selected from $-H$, $-CH_3$, and the epoxy group,

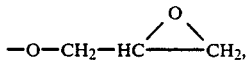

at least two of which are the epoxy group, and preferably $R_7$ and $R_{10}$ are both epoxy groups, and

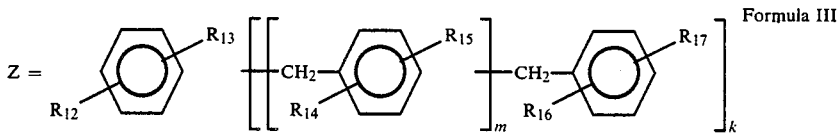

where $R_{12}$, $R_{13}$, $R_{14}$, $R_{15}$, $R_{16}$, $R_{17}$ are selected from —H, —CH$_3$, and the epoxy group,

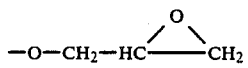

and k=0 or 1, m=0 to 9, with at least one epoxy group present on each aryl group, except when k=0, wherein both $R_{12}$, $R_{13}$ are the epoxy group.

The flourene curative is represented by the following formula

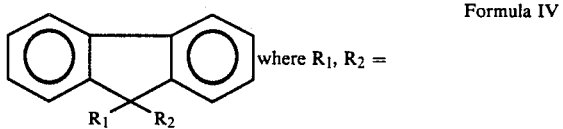

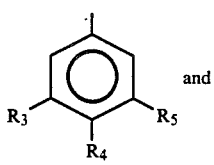

where $R_3$, $R_5$ is —H, —CH$_3$, and $R_4$ is —NH$_2$, or —NHCH$_3$.

An effective ratio of the phenoxy resin, the epoxy resin and the fluorene curative is defined as that ratio of these components which will provide an adhesive composition having a suitable shelf life at or below room temperature, a substantially tack-free adhesive film at a desired handling temperature, and a tacky adhesive at a desired laminating temperature, and which will cure to a hard, tough adhesive material at an appropriate bonding temperature with good thermal stability at elevated temperatures.

It has been discovered that an effective amount of the phenoxy resin is between about 10 and 80 percent, the fluorene curative is between about 5 and 50 percent, $Y_E$ is between about 0 and 70 percent, and Z is between about 0 and 50 percent all by weight, with at least 5 percent $Y_E$ or Z present.

DETAILED DESCRIPTION

The adhesive composition of the present invention may be produced by combining an effective amount of the phenoxy resin, the fluorene curative, $Y_E$ and/or Z to provide an adhesive having the characteristics suited for a particular application.

The fluorene curative, may be any suitable compound represented by the above Formula IV which imparts the desired resultant characteristics to the adhesive film.

Examples of suitable fluorene curatives are described in copending application Ser. No. 830,552 filed Feb. 18, 1986, now U.S. Pat. No. 4,684,678, and include
9,9-Bis(4-aminophenyl)fluorene,
9,9-Bis(3-methyl-4-aminophenyl)fluorene,
9-(3-methyl-4-aminophenyl)-9-(3-methyl-4-methylaminophenyl)fluorene,
9,9-Bis(3-methyl-4-methylaminophenyl)fluorene,
9,9-Bis(4-methylaminophenyl)fluorene, and
9-(4-methylaminophenyl)-9-(4-aminophenyl)fluorene.

As is evident from the above list of compounds, di-, tri-, and tetra-aminofunctional fluorene compounds can be used. The exclusive use of a difunctional curative will result in chain extension without cross-linking, resulting in a very tough polymer with medium temperature performance. The exclusive use of a tetrafunctional curvative will result in a highly cross-linked, moderately hard polymer, with very high temperature performance. The use of a combination of these compounds provides toughness and high temperature performance without the brittleness associated with materials lacking the large pendant fluorene structure.

The phenoxy resins represented by Formula I above, are typically present in the range of between about 10 and 80 percent by weight. The presence of the phenoxy resin is believed to increase tack, decrease brittleness, allow the adhesive to be a self-supporting film, increase toughness and add to cohesive strength. Suitable phenoxy resins, wherein X in Formula I is —C(CH$_3$)$_2$— having an average molecular weight of from 25,000 to 35,000 are available as VCAR Phenoxy Resins from Union Carbide Co.

The epoxy resins, $Y_E$, represented by Formula II above, are typically present in the range of between about 0 and 70 percent by weight. Examples of $Y_E$ include 2,2-Bis[4-(2,3-oxypropoxy)phenyl]propane, 4,4'-Bis(2,3-oxypropoxy)biphenyl. In general it is preferred that $R_7$ and $R_{10}$ are epoxy functional while $R_6$, $R_8$, $R_9$, $R_{11}$ are either a hydrogen or a methyl group. $Y_E$ must contain at least two epoxy functional groups so that chain extension can occur.

The epoxy resins, Z, represented by Formula III above, are typically present in the range of between about 0 and 50 percent by weight. Examples of Z include epoxy novolac resins in which $R_{12}$, $R_{14}$, $R_{16}$ are —H and $R_{13}$, $R_{15}$, $R_{17}$ are

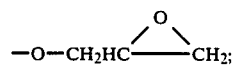

and cresol epoxy novolac resins in which $R_{12}$, $R_{14}$, $R_{16}$ are —CH$_3$. It is generally preferred that k=1 and m=1 to 3.

The use of a suitable filler in the adhesive composition may provide benefits of increased density, tensile strength, and adhesion, with a concomitant decrease in permeability. Such fillers can be used to improve thermal and/or electrical conductivity of the adhesive and also to reduce the coefficient of thermal expansion of the cured adhesive. It is desirable, whenever a filler is used, that it be thoroughly wet by the adhesive and combine completely to eliminate air entrapment. This may be accomplished by the use of surfactant-treated fillers, or through the use of epoxy-functional or amino-functional silanes as a pre-treatment of the filler. This provides desirable surface properties, and a mechanism for chemically bonding the filler into the adhesive matrix at cure. An example of this is Kaolin, $Al_2Si_2O_7 \cdot 2H_2O$ which has been treated with $\beta(3,4$-epoxycyclohexyl)ethyltrimethoxy silane.

Ideally, an adhesive of this type is a self-supporting film. Prior art liquid epoxy systems require constant mixing to maintain suitable dispersion of silver or other conductive particles, and must be dispensed in excess to assure that the entire die bonding surface is wet during die placement. These liquid systems by their nature will migrate due to capillary action and may contaminate or cover critical areas of the die or substrate in which no adhesive may be tolerated. The present invention, as a film, is capable of being sawn with the wafer to the precise size of the die. This provides the exact amount of adhesive in the presice area necessary for die bonding. Flow of this adhesive is very limited, and may occur only at the time of binding, when flow is desired.

The adhesive is desired to be relatively tack free to enable handling and repositioning on the undiced wafer prior to lamination. Handling typical takes place at or near room temperature, but the adhesive composition can be adjusted to provide a substantial lack of tack at higher temperatures. Following correct positioning, warming the adhesive to a suitable lamination temperature, such as 50° C. to 100° C., will provide a suitable tackiness which will adhere the adhesive to the wafer for subsequent dicing processes.

The thus-laminated wafer is next sawn into individual integrated circuits, or dice. These discrete dice are then removed for bonding by a suitable means, typically a vacuum chuck of a "pick-and-place" machine. Each die has the precisely sawn adhesive still adhered to its bonding surface. The die is then placed onto the bonding area of the recipient substrate which has been preheated to 150° C. to 350° C., at which time bonding occurs. The preceding cures to a hard, tough bonding medium with good thermal stability at elevated temperatures.

In the following, non-limited examples, all parts are by weight.

EXAMPLE 1

An adhesive of the present invention was made by mixing together 25 parts of PKHS, a phenoxy resin from the Union Carbide Corporation, 52 parts of Quatrex 1010, a diglycidyl ether of bisphenol A epoxy resin from the Dow Chemical Company, and 23 parts of 9,9-bis(3-methyl-4-aminophenyl)fluorene (hereinafter BAFOT). These three constituents were stirred to a uniform paste, using methyl ether ketone (MEK) as a solvent for the solution of the phenoxy and epoxy resins, followed by blending in the relatively insoluble BAFOT, and dilution of the resultant paste to 50% solids by weight with additional MEK. The fluorene-amine curative was prepared for dispersion in this epoxy resin system by jet milling to a mean particle size of <5 um. To this dispersion an accelerator, the triflic acid half salt of 2-ethyl-4-methylimidazole was added at a rate of 4 parts per hundred of the solids in the dispersion.

The epoxy adhesive system was coated onto the exterior surface of a 0.2 mil thick corrugated step-V nickel plating on a polymer base from this 50% solids by weight dispersion. The coating was applied at room temperature, followed by air drying for 30 minutes, and one minute drying at 80° C. in a forced air oven. The coating was accomplished on a knife coater at 2 mils above the peaks of the step-V design of the nickel plating, resulting in a dry coating approximating the height of the step-V's, nominally 0.7 mil.

The adhesive-coated nickel structure was then delaminated from the similarly structured substrate polymer by peeling the polymer from the metal/adhesive composite at an angle of greater than 90° but less than 180°. The uncoated side of the nickel metallization was then coated in a manner identical to that of the first side with the epoxy adhesive system, and dried in a similar manner.

The adhesive/metal/adhesive composite was then applied to a 3 inch diameter aluminized silicon wafer by heating the wafer to about 80° C. on a hotplate surface, then applying the composite using a 2 mils thick sheet of Teflon as a release liner, both beneath the wafer and above the composite adhesive film. Pressure was applied with a rubber roller to exclude air bubbles in the wafer/adhesive interface, and the thus-laminated structure was removed from the hot surface after not more than one minute of exposure to the elevated temperature.

The excess adhesive composite was trimmed from the edges of the wafer with a sharp blade, then the adhesive composite surface of the laminate applied to a frame-mounted Nitto wafer dicing film. Thus mounted, the wafer and adhesive were then cut into individual dice, $0.050 \times 0.050$ inch (1.3 mm $\times$ 1.3 mm) using a Disco Dicer, a standard wafer dicing saw common to the microelectronics industry, with a water-cooled diamond composite blade. The diced water/adhesive/Nitto film composite was then stretched and expanded by roughly 50% to separate the individual dice for ready removal from the wafer dicing tape. This was accomplished by warming the wafer tape to about 60° C. with a hot air gun as the tape was stretched over the lip of a metal cylinder. Dice from the expanded wafer were bonded to silver-palladium pads on an alumina substrate using bonding parameters of 10 seconds, 100 grams (88 psi) and 275° C. The dice thus bonded exhibit shear strengths on the order of 4000 psi and conductivities through the die attach adhesive layer on the order of 1 m$\Omega$.

A series of tests was performed upon dice which were prepared as described in Example 1 and bonded under the conditions thus described, the results of which were as follows:

Shear strength was measured over a range of from 25° C. to 275° C. The MIL-883c standard for 0.05" by 0.05" dice is 1760 psi at room temperature. Shear strength ranged from greater than 4000 psi at room temperature to greater than 1300 psi at 125° C., at approximately 200 psi at 200°–275° C.

Thermal excursion studies were conducted to simulate the effects of exposure of the bonded dice to temperatures as high as 400° C. The adhesive exhibited stability to exposures as high as 350° C. for a period of up to one minute without significant degradation, and to more protracted exposure at lower temperatures.

The described die-attach adhesive composite of Example 1 was subjected to exposure at 85° C., 85% relative humidity for in excess of 1000 hours to determine its stability under these conditions. Four-wire resistance measurements conducted over the period of the test indicate no significant degradation of contact resistance, a measure of adhesive degradation.

Dice bonded with the adhesive composite of Example 1 were exposed to thermal cycling over a range of from $-65°$ C. to $150°$ C. for a period in excess of 1000 hours, and exhibited no significant degradation of performance as measured by four-wire resistance studies throughout this period.

Dice bonded with the adhesive composite of Example 1 were exposed to thermal soaks of up to $150°$ C. for in excess of 1000 hours with no significant degradation as measured by four-wire resistance studies.

EXAMPLES 2-9

Adhesives of the present invention were made by methods very similar to that described in Example 1. The composition of these adhesives are described below.

TABLE 1

| Components | EXAMPLE | | | | | | | |
|---|---|---|---|---|---|---|---|---|
| | 2 | 3 | 4 | 5 | 6 | 7 | 8 | 9 |
| | Weight Percent | | | | | | | |
| PKHS | 40 | 40 | 33 | 25 | 13 | 21 | 35 | 25 |
| Quatrex 1010 | 40 | 20 | 33 | 44 | 43 | 55 | 46 | 55 |
| BAFOT | 20 | 20 | 17 | 19 | 27 | 24 | 19 | 20 |
| Quatrex 3310* | | 20 | 17 | 12 | 17 | | | |

*3310 is a cresol epoxy novalac resin from the Dow Chemical Company.

The adhesives of Examples 2-9 formed suitable films when used in the manner described in Example 1 and exhibited shear strengths similar to that of Example 1.

What is claimed is:

1. An adhesive composition having utility as a die-attach adhesive comprising the reaction product of an admixture of a phenoxy resin, fluorene curative, and at least one epoxy resin wherein said phenoxy resin is represented by the formula:

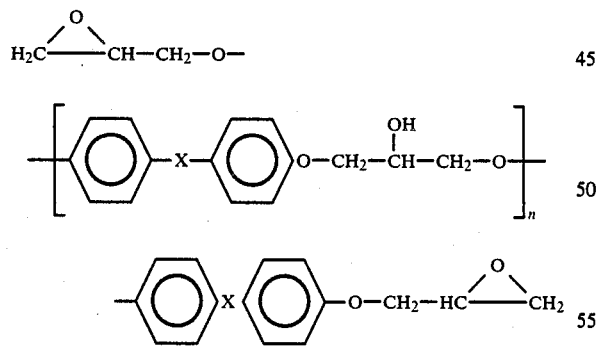

where $n=50$ to 150 and $X=$ a single bond, $-CH_2-$, or $-C(CH_3)_2-$;

wherein said fluorene curative is represented by the formula:

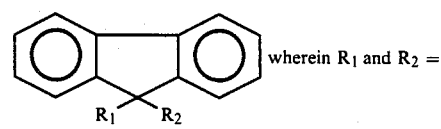 wherein $R_1$ and $R_2 =$

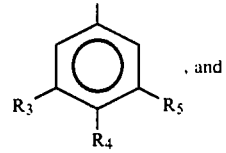, and wherein $R_3$ and $R_5$ are independently selected from $-H$, or $-CH_3$, and $R_4$ is $-NH_2$ or $-NHCH_3$; and wherein said at least one epoxy resin comprises $Y_E$, Z or a mixture thereof, represented by the formulas:

$Z =$

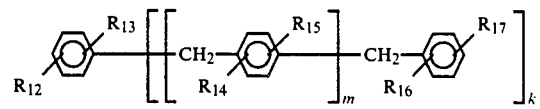

where $R_{12}$, $R_{13}$, $R_{14}$, $R_{15}$, $R_{16}$ and $R_{17}$ are independently selected from $-H$, $-CH_3$, or

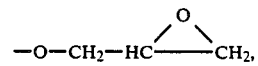

$k=0$ or 1, $m=0$ to 9, with at least one epoxy group present on each aryl group, except when $k=0$, wherein both $R_{12}$ and $R_{13}$ are epoxy groups; and

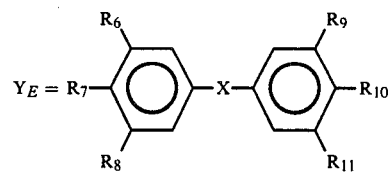

where $X=$ a single bond, $-CH_2-$, $-C(CH_3)_2-$, or

and $R_6$, $R_7$, $R_8$, $R_9$, $R_{10}$ and $R_{11}$ are independently selected from $-H$, $-CH_3$, or the epoxy group,

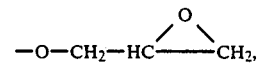

at least two of which are said epoxy group.

2. The adhesive composition of claim 1 wherein $R_7$ and $R_{10}$ are

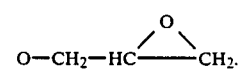

3. The adhesive composition of claim 1 further including a catalyst capable of increasing the rate of the reaction between said phenoxy resin, said fluorene curative, and said at least one epoxy resin.

4. The adhesive composition of claim 1 further including a filler material.

5. The adhesive composition of claim 4 wherein said filler material contains a functionally reactive silane, said filler material present in the range of from about 10% to 70% by volume.

6. The adhesive composition of claim 5 wherein said functionally reactive silane is amine or epoxy functional.

7. The adhesive composition of claim 2 wherein said phenoxy resin is present in the range of from about 10 to 80 percent by weight.

8. The adhesive composition of claim 7 wherein said fluorene curative is present in the range of from about 5 to 50 percent by weight.

9. The adhesive composition of claim 7 containing up to about 70 percent by weight of $Y_E$, and up to about 50 percent by weight of Z, with at least 5 percent of $Y_E$ or Z present.

10. The adhesive composition of claim 1 wherein K is 1 and m is 1, 2 or 3.

11. The adhesive composition of claim 1 wherein $R_7$ and $R_{10}$ are epoxy functional and $R_6$, $R_8$, $R_9$ and $R_{11}$ are selected from —H, or —CH$_3$.

12. The adhesive composition of claim 1 wherein said composition is a self-supporting film.

* * * * *